United States Patent
Mase et al.

(10) Patent No.: US 9,041,917 B2
(45) Date of Patent: May 26, 2015

(54) RANGE SENSOR AND RANGE IMAGE SENSOR

(71) Applicant: HAMAMATSU PHOTONICS K.K., Hamamatsu-shi, Shizuoka (JP)

(72) Inventors: Mitsuhito Mase, Hamamatsu (JP); Takashi Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/077,029

(22) Filed: Nov. 11, 2013

(65) Prior Publication Data

US 2014/0071429 A1    Mar. 13, 2014

Related U.S. Application Data

(63) Continuation of application No. 12/992,422, filed as application No. PCT/JP2009/058572 on May 1, 2009, now Pat. No. 8,599,364.

(30) Foreign Application Priority Data

May 15, 2008    (JP) ................................. 2008-128681

(51) Int. Cl.
| | |
|---|---|
| *G01C 3/08* | (2006.01) |
| *G01S 17/89* | (2006.01) |
| *G01S 17/93* | (2006.01) |
| *H01L 27/146* | (2006.01) |

(Continued)

(52) U.S. Cl.
CPC . *G01C 3/08* (2013.01); *G01S 7/481* (2013.01); *G01S 17/89* (2013.01); *G01S 17/936* (2013.01); *H01L 27/14603* (2013.01); *H01L 31/02024* (2013.01); *G01S 7/4863* (2013.01)

(58) Field of Classification Search
USPC ........ 356/3.13–315, 4.01, 4.05, 28, 28.5, 222
See application file for complete search history.

(56) References Cited

U.S. PATENT DOCUMENTS 3,969,634 A * 7/1976 Su et al. ........................ 377/57
4,794,259 A * 12/1988 Sanderson et al. ............ 250/397

(Continued)

FOREIGN PATENT DOCUMENTS

| JP | H9-162380 | 6/1997 |
| JP | 2000-049322 | 2/2000 |

(Continued)

*Primary Examiner* — Luke Ratcliffe
*Assistant Examiner* — Assres H Woldemaryam
(74) *Attorney, Agent, or Firm* — Drinker Biddle & Reath LLP

(57) ABSTRACT

The range image sensor is a range image sensor which is provided on a semiconductor substrate with an imaging region composed of a plurality of two-dimensionally arranged units (pixel P), thereby obtaining a range image on the basis of charge quantities $Q_L$, $Q_R$ output from the units. One of the units is provided with a charge generating region (region outside a transfer electrode 5) where charges are generated in response to incident light, at least two semiconductor regions 3 which are arranged spatially apart to collect charges from the charge generating region, and a transfer electrode 5 which is installed at each periphery of the semiconductor region 3, given a charge transfer signal different in phase, and surrounding the semiconductor region 3.

10 Claims, 16 Drawing Sheets

(51) Int. Cl.
*G01S 7/486* (2006.01)
*G01S 7/481* (2006.01)
*H01L 31/02* (2006.01)

(56) References Cited

U.S. PATENT DOCUMENTS

| | | | | |
|---|---|---|---|---|
| 5,003,565 | A | * 3/1991 | Yoshida | 377/60 |
| 5,381,338 | A | * 1/1995 | Wysocki et al. | 701/409 |
| 5,414,439 | A | 5/1995 | Groves et al. | |
| 5,627,388 | A | * 5/1997 | Shinji | 257/223 |
| 5,808,333 | A | 9/1998 | Maruyama et al. | |
| 6,335,239 | B1 | * 1/2002 | Agahi et al. | 438/245 |
| 6,489,658 | B2 | 12/2002 | Richter et al. | |
| 6,586,789 | B1 | * 7/2003 | Zhao | 257/292 |
| 6,653,636 | B2 | * 11/2003 | Busse et al. | 250/370.09 |
| 6,952,022 | B2 | * 10/2005 | Jang et al. | 257/59 |
| 7,184,083 | B2 | * 2/2007 | Yamada | 348/294 |
| 7,209,221 | B2 | 4/2007 | Breed et al. | |
| 7,781,811 | B2 | * 8/2010 | Kawahito et al. | 257/292 |
| 7,876,422 | B2 | * 1/2011 | Hashimoto et al. | 356/4.07 |
| 7,906,826 | B2 | * 3/2011 | Martin et al. | 257/444 |
| 8,134,690 | B2 | * 3/2012 | Tachino et al. | 356/4.01 |
| 8,289,427 | B2 | 10/2012 | Kawahito | 348/302 |
| 2002/0024071 | A1 | 2/2002 | Kawajiri et al. | |
| 2003/0209712 | A1 | * 11/2003 | Fujita et al. | 257/72 |
| 2005/0087773 | A1 | 4/2005 | Kuwazawa | |
| 2005/0116259 | A1 | * 6/2005 | Komori | 257/222 |
| 2005/0178946 | A1 | * 8/2005 | Hashimoto et al. | 250/208.1 |
| 2005/0285165 | A1 | 12/2005 | Ohkawa et al. | |
| 2006/0192938 | A1 | * 8/2006 | Kawahito | 356/5.03 |
| 2007/0103569 | A1 | * 5/2007 | Kawahito | 348/241 |
| 2007/0103748 | A1 | * 5/2007 | Hashimoto et al. | 359/15 |
| 2007/0158770 | A1 | * 7/2007 | Kawahito | 257/431 |
| 2009/0230437 | A1 | * 9/2009 | Kawahito et al. | 257/226 |
| 2010/0141927 | A1 | * 6/2010 | Hashimoto et al. | 356/4.01 |

FOREIGN PATENT DOCUMENTS

| | | | |
|---|---|---|---|
| JP | 2000-517427 | 12/2000 | |
| JP | 2002-057316 | 2/2002 | |
| JP | 2002-164527 | 6/2002 | |
| JP | 2003-051988 | 2/2003 | |
| JP | 2005-086001 | 3/2005 | |
| JP | 2005-235893 | 9/2005 | |
| JP | 2006-013285 | 1/2006 | |
| JP | 2007-123679 | 5/2007 | |
| JP | 2008-078490 | 4/2008 | |
| JP | 2008-145348 | 6/2008 | |
| JP | 2012-189599 | 10/2012 | |
| WO | 2007/026779 A1 | 3/2007 | |
| WO | WO2008081997 | * 7/2008 | H01L 27/148 |

* cited by examiner ized donors
RANGE SENSOR AND RANGE IMAGE SENSOR

This is a continuation application of copending application Ser. No. 12/992,422, having a §371 date of Feb. 23, 2011, which is a national stage filing based on PCT International Application No. PCT/JP2009/058572, filed on May 1, 2009. The copending application Ser. No. 12/992,422 is incorporated by reference herein in its entirety.

TECHNICAL FIELD

The present invention relates to a range sensor and a range image sensor loaded on product monitors in a production line of a factory as well as on vehicles and others.

BACKGROUND ART

A conventional range finder has been described, for example, in Patent Literature 1. In the present range image sensor, all four sides of a photo sensitive region into which light is made incident are surrounded by four transfer gate electrodes, transfer voltages different in phase are applied to these transfer gate electrodes, and charges generated at a photo sensitive region will flow sequentially into four charge accumulating regions located outside the transfer gate electrodes. In the range image sensor, on the basis of charge quantities distributed into the accumulating regions, a distance to an object is calculated.

CITATION LIST

Patent Literature

Patent Literature 1: Japanese Translation of International Application (Kohyo) No. 2000-517427

SUMMARY OF INVENTION

Technical Problem

However, since a range image sensor having a conventional range sensor is constituted so as to surround the periphery of a subtle-light incident region with four triangular transfer gate electrodes, it is poor in aperture ratio and also unable to collect charges generated at a position apart from the light incident region. Thus, the charges are collected at a lower efficiency and uncollected charges are highly likely to cause crosstalk. Further, an increase in pixels will require a longer transfer gate electrode. As described above, a conventional range image sensor is unable to enhance an efficiency of collecting charges and lower in signal level, thus failing in obtaining a range image excellent in S/N ratio.

The present invention has been made in view of the above problems, an object of which is to provide a range sensor capable of obtaining distance output excellent in S/N ratio and a range image sensor capable of obtaining a range image excellent in S/N ratio.

Solution to Problem

In order to solve the above-described problems, a range sensor of the present invention is provided with a charge generating region at which charges are generated in response to incident light, at least two charge collecting regions which are arranged spatially apart from each other to collect charges from the charge generating region and a transfer electrode which is installed at each periphery of the charge collecting region, given a charge transfer signal different in phase, and surrounding the charge collecting region. A range image sensor of the present invention is provided on a semiconductor substrate with an imaging region composed of a plurality of two-dimensionally arranged units, wherein a range image is obtained on the basis of charge quantities output from the units. One of the units is composed of the above-described range sensor.

A two-dimensional arrangement of a plurality of units results in location of a plurality of transfer electrodes at peripheries of the charge generating regions. To put it the other way around, the charge generating regions are to locate also at peripheries of transfer electrodes. Since transfer electrodes surround the charge collecting regions, charge transfer signals are imparted to the transfer electrodes, thus making it possible to transfer charges from all directions to the charge collecting regions. In other words, substantially all the peripheral regions of the transfer electrodes are allowed to function as a charge generating region, thereby remarkably improving an aperture ratio. Therefore, a signal level can be increased to obtain a range image excellent in S/N ratio. With attention given to one range sensor, it is possible to transfer charges from all directions outside the transfer electrodes into the charge collecting regions, thus making it possible to collect a great quantity of charges. A distance is measured on the basis of the charges, by which distance output excellent in S/N ratio can be obtained.

It is also acceptable that at least two charge collecting regions surrounded by transfer electrodes to which a charge transfer signal of the same phase is imparted are electrically connected. In this instance, charge quantities output from these charge collecting regions are averaged, thus making it possible to compensate for a difference in characteristics at each charge collecting region.

Further, it is preferable that a range image sensor of the present invention is additionally provided with potential adjusting means installed at a charge generating region to make steep a potential gradient from the charge generating region to a charge collecting region. The potential adjusting means makes the potential gradient steep, by which charges transferred from the charge generating region to the charge collecting region will move at a high speed. In other words, high-speed imaging is made possible.

The above potential adjusting means is of a conductive type different from the charge collecting region and can be constituted with a semiconductor region higher in impurity concentration than the periphery. A difference in conductive type makes it possible to increase a potential gradient.

Further, the potential adjusting means is characterized in being an electrode to which a predetermined potential is imparted. A potential reverse to a potential by ionized donors or acceptors at the charge collecting region is imparted to the above potential, by which it is possible to increase a potential gradient.

Still further, a transfer electrode is preferably formed in an annular shape. Thereby, it is possible to reliably collect charges flowing into the charge collecting region from all directions and also prevent the inflow. In addition, the transfer electrode can be formed in an annular shape having a gap. In this instance as well, it is possible to reliably collect charges flowing into the charge collecting region from all directions.

Advantageous Effects of Invention

According to a range sensor of the present invention, it is possible to obtain distance output higher in its charge collecting efficiency and excellent in S/N ratio. According to a range image sensor using a plurality of the range sensors, it is possible to obtain a range image higher in its charge collecting efficiency and excellent in S/N ratio.

DESCRIPTION OF EMBODIMENTS

Hereinafter, a description will be given of a range image sensor having a range sensor according to embodiments of the present invention. It is noted that the same elements will be given the same symbols and an overlapping description will be omitted.

Figure 1:
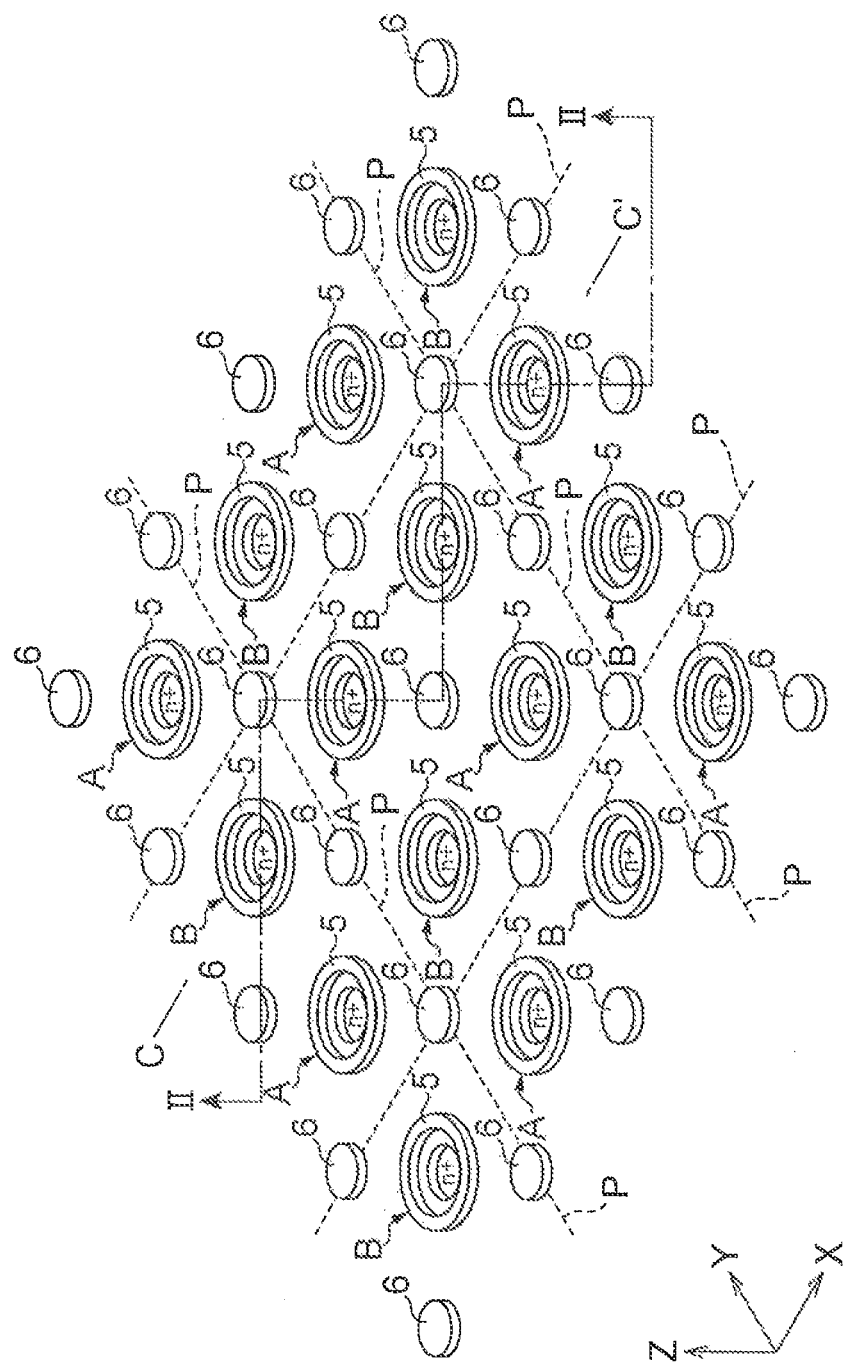
FIG. 1 is a perspective view of an enlarged imaging region.
Figure 2:
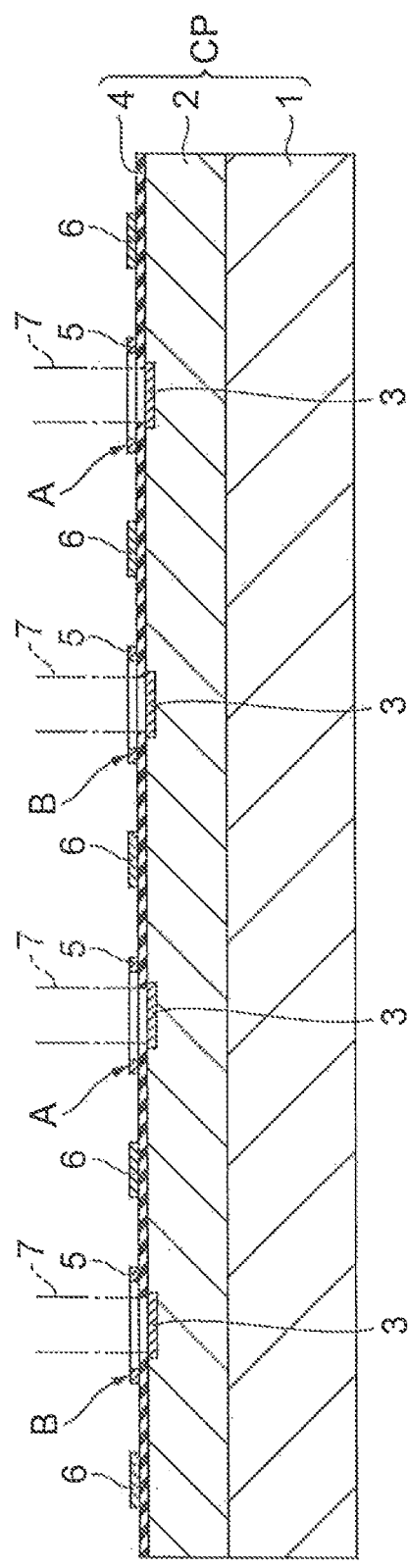
FIG. 2 is a cross sectional view taken along the arrow II-II of the imaging region.

FIG. 1 is a perspective view of an imaging region of the range image sensor according to Embodiment 1. FIG. 2 is a cross sectional view taken along the arrow II-II of the imaging region.

On a p-type semiconductor substrate 1, there is grown a p-type epitaxial layer 2 lower in concentration than the semiconductor substrate 1, and inside the epitaxial layer 2, an n-type semiconductor region (charge collecting region) 3 higher in concentration is provided in a matrix form. It is noted that a substrate including the epitaxial layer 2 is also to be a semiconductor substrate. The surface of the epitaxial layer 2 is covered with an insulating layer 4 and on the insulating layer 4, there is installed a contact hole for exposing the surface of a semiconductor region 3. A conductor 7 for connecting the semiconductor region 3 to the outside is passed through the contact hole.

On the insulating layer 4 at the periphery of the semiconductor region 3, there is provided an annular transfer electrode (gate) 5. At a region outside the transfer electrode 5, a charge generating region is spread out and at the center of the charge generating region inside pixels, a potential adjusting portion (potential adjusting means) 6 is installed. The potential adjusting portion 6 of the present embodiment is an electrode arranged on the insulating layer 4. When an XYZ orthogonal coordinate system is set, one pixel P is formed inside an XY plane to give a quadrangular shape, thereby constituting a range sensor. The potential adjusting portion 6 is located at the center of a pixel which is a quadrangular shape, at a corner or at the middle point of each side. Inside one pixel P, four transfer electrodes 5 are contained and lines connecting the centers of these are able to form a quadrangular shape. On the center of the diagonal lines, located is one potential adjusting portion 6.

The semiconductor region 3 is to collect charges generated outside transfer electrodes 5, depending on light which is made incident. A transfer electrode 5 in which a phase of a charge transfer signal to be applied thereto is at 0 degrees is referred to as A, and that in which the phase is at 180 degrees is referred to as B. Regarding these transfer electrodes 5, those which are different in type are alternately arrayed along a direction of the X axis, and those different in type are alternately arrayed along a direction of the Y axis as well. In other words, when attention is given to one transfer electrode A, a transfer electrode B is adjacent in the direction of the X axis and in the direction of the Y axis in the periphery thereof. When attention is given to one transfer electrode B, a transfer electrode A is adjacent in the direction of the X axis and in the direction of the Y axis in the periphery thereof. It is noted that when attention is given to a phase of voltage applied to a transfer electrode, a description will be given by referring to transfer electrodes A and B, and when an attention is given to a transfer electrode irrespective of the phase, a description will be given as transfer electrodes 5.

As light which is made incident into the center of one pixel P is converted to a charge inside a semiconductor substrate, the thus generated charge travels to any direction of transfer electrodes 5 in accordance with a potential gradient formed by a potential adjusting portion 6.

When a positive potential is imparted to a transfer electrode 5, a gate is opened by the transfer electrode 5, and a negative charge (electron) is drawn into a direction of the transfer electrode 5 and accumulated inside a potential well formed by an n-type semiconductor region 3. An n-type semiconductor contains a positively ionized donor to have a positive potential, thereby attracting electrons.

When a potential lower than the positive potential (ground potential) is imparted to a transfer electrode 5, a gate is closed by a transfer electrode 5 and charges generated at a semiconductor region 3 will not be drawn into the semiconductor region 3.

It is noted that the semiconductor and the insulating layer 4 are respectively made with Si and $SiO_2$, while the transfer electrode 5 and the potential adjusting portion 6 are made with polysilicon. However, they may be made with different materials.

Figure 3:
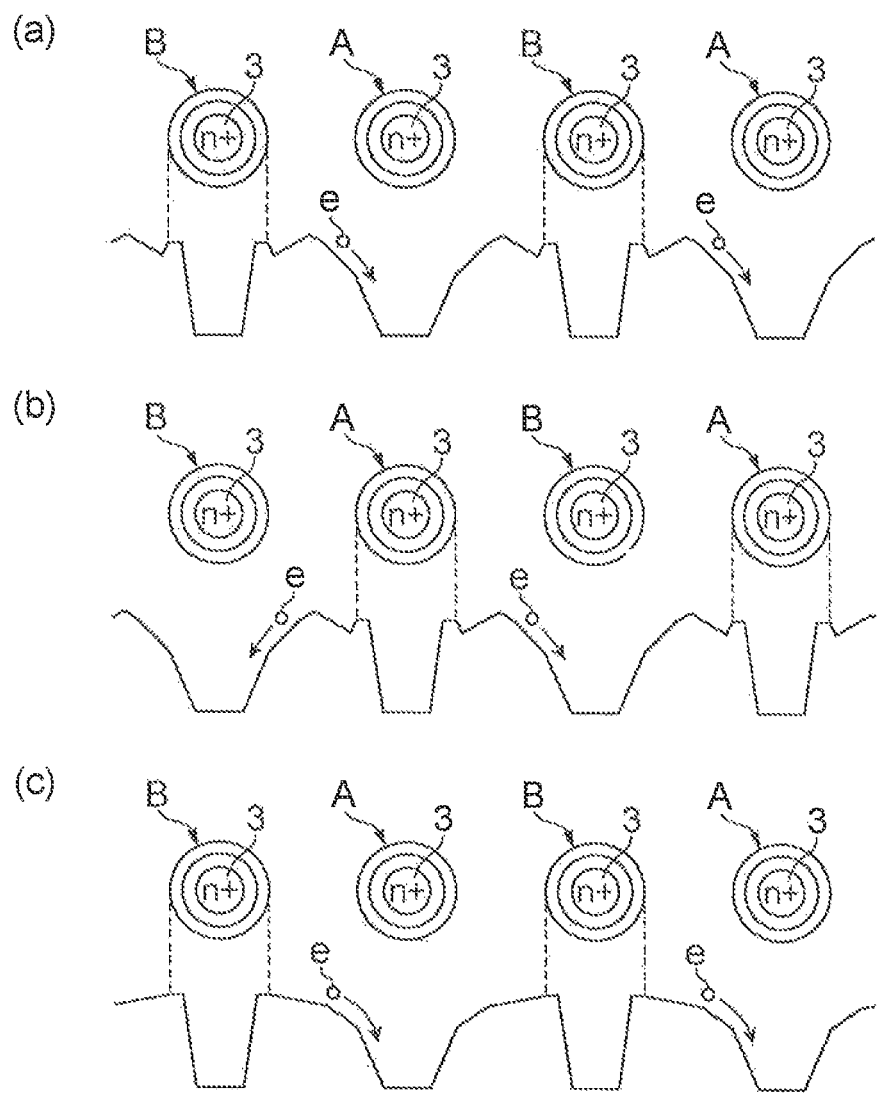
FIG. 3 is a view showing potential distributions at the imaging region.

FIG. 3 is a view showing potential distributions at an imaging region.

FIG. 3(a) shows a potential diagram taken along a crosswise direction of the cross section given in FIG. 2 when a phase of a transfer electrode A is at 0 degrees, and FIG. 3(b) is a potential diagram taken along a crosswise direction of the cross section given in FIG. 2 when the phase of the transfer electrode A is at 180 degrees. Further, FIG. 3(c) is a potential diagram in a crosswise direction of the cross section taken along the line C-C' given in FIG. 1 in a state given in FIG. 3(a). It is noted that in FIG. 3, the downward direction indicates a direction of a positive potential.

As shown in FIG. 3(a), when a phase of a transfer electrode A is at 0 degrees, a positive potential is imparted to the transfer electrode A, while to a transfer electrode B, imparted is a reverse potential, in other words, a potential whose phase is at 180 degrees (ground potential). In this instance, a negative charge e which is generated at a charge generating portion located between the transfer electrode A and the transfer electrode B flows into a semiconductor region which is inside the transfer electrode A due to reduction in potential barrier of a semiconductor immediately under the transfer electrode A. On the other hand, there is no reduction in potential barrier of a semiconductor immediately under the transfer electrode B, and no charge flows into the semiconductor region 3 inside the transfer electrode B.

Further, as shown in FIG. 3(b), when a phase of a transfer electrode B is at 0 degrees, a positive potential is imparted to the transfer electrode B, while to a transfer electrode A, imparted is a reverse potential, in other words, a potential whose phase is at 180 degrees (ground potential). In this instance, a negative charge e which is generated at a charge generating portion located between the transfer electrode A and the transfer electrode B flows into a semiconductor region which is inside the transfer electrode B due to reduction in potential barrier of a semiconductor immediately under the transfer electrode B. On the other hand, there is no reduction in potential barrier of a semiconductor immediately under the transfer electrode A, and no charge flows into the semiconductor region 3 inside the transfer electrode A.

Further, as shown in FIG. 3(c), normally, between a transfer electrode A and a transfer electrode B, no potential adjusting portion 6 is located. Inside a cross section which is not through the potential adjusting portion 6, at a middle point between the transfer electrode A and the transfer electrode B, there is observed no potential barrier as found in FIG. 3(a) and FIG. 3(b). On the other hand, since the cross sections shown in FIG. 3(a) and FIG. 3(b) are through the potential adjusting portion 6, energy is high at the middle point between the transfer electrodes A and B and a potential gradient is steep to realize a high-speed charge transfer. It is noted that charges generated between the transfer electrodes A and B given in FIG. 3(c) also flow into the semiconductor region 3.

Figure 4:
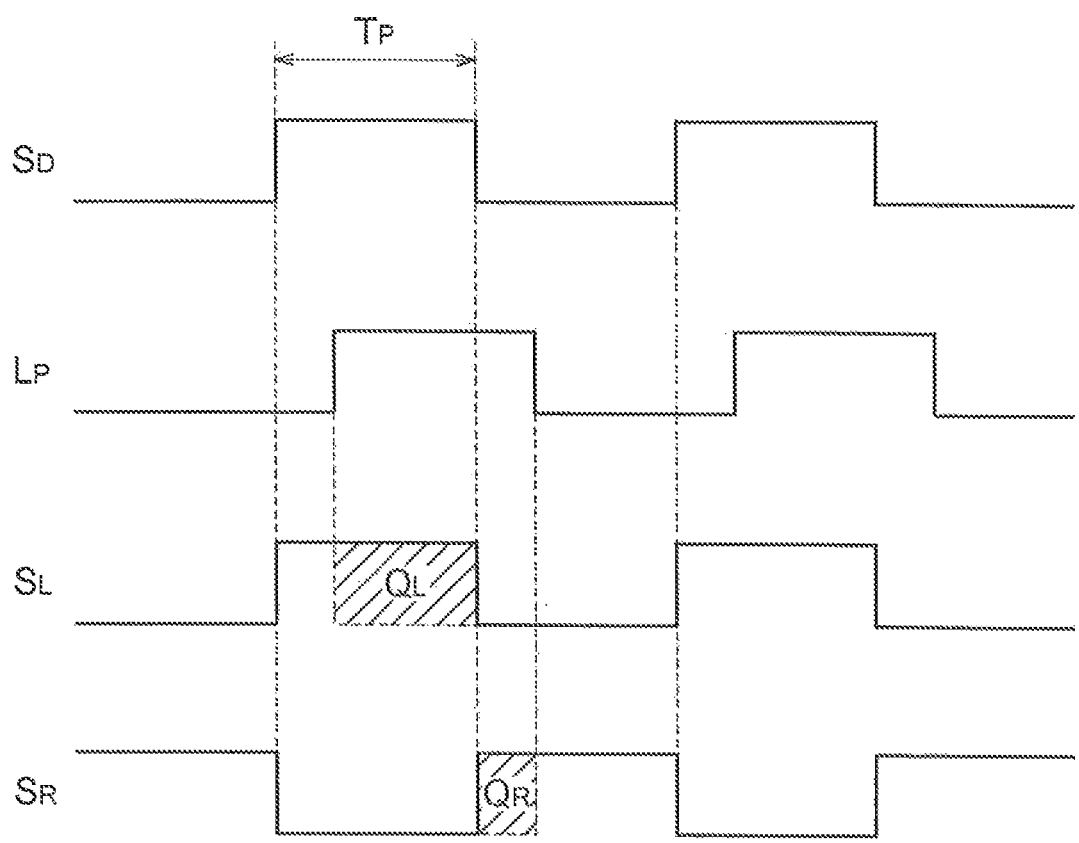
FIG. 4 is a timing chart of various signals.

FIG. 4 is a timing chart of various signals.

There are shown a driving signal $S_D$ of a light source to be described later, an intensity signal $L_P$ of reflected light which returns back to an imaging region when the light source hits against an object, a charge transfer signal $S_L$ applied to a transfer electrode A and a charge transfer signal $S_R$ applied to a transfer electrode B. Since the charge transfer signal $S_L$ is in synchronization with the driving signal $S_D$, a phase of the intensity signal $L_P$ of reflected light with respect to the charge transfer signal $S_L$ is time-of-flight of light, which indicates a distance between a sensor to an object. In this instance, upon application of the respective charge transfer signals $S_L$ and $S_R$, a ratio of $Q_L$ to $Q_R$ which are quantities of charges collected at the semiconductor region 3 is used to calculate a distance d. In other words, when one pulse width of a driving signal is given as $T_P$, there is obtained a formula, distance $d=(c/2)\times(T_P \times Q_R/(Q_L+Q_R))$. It is noted that c denotes velocity of light.

Figure 5:
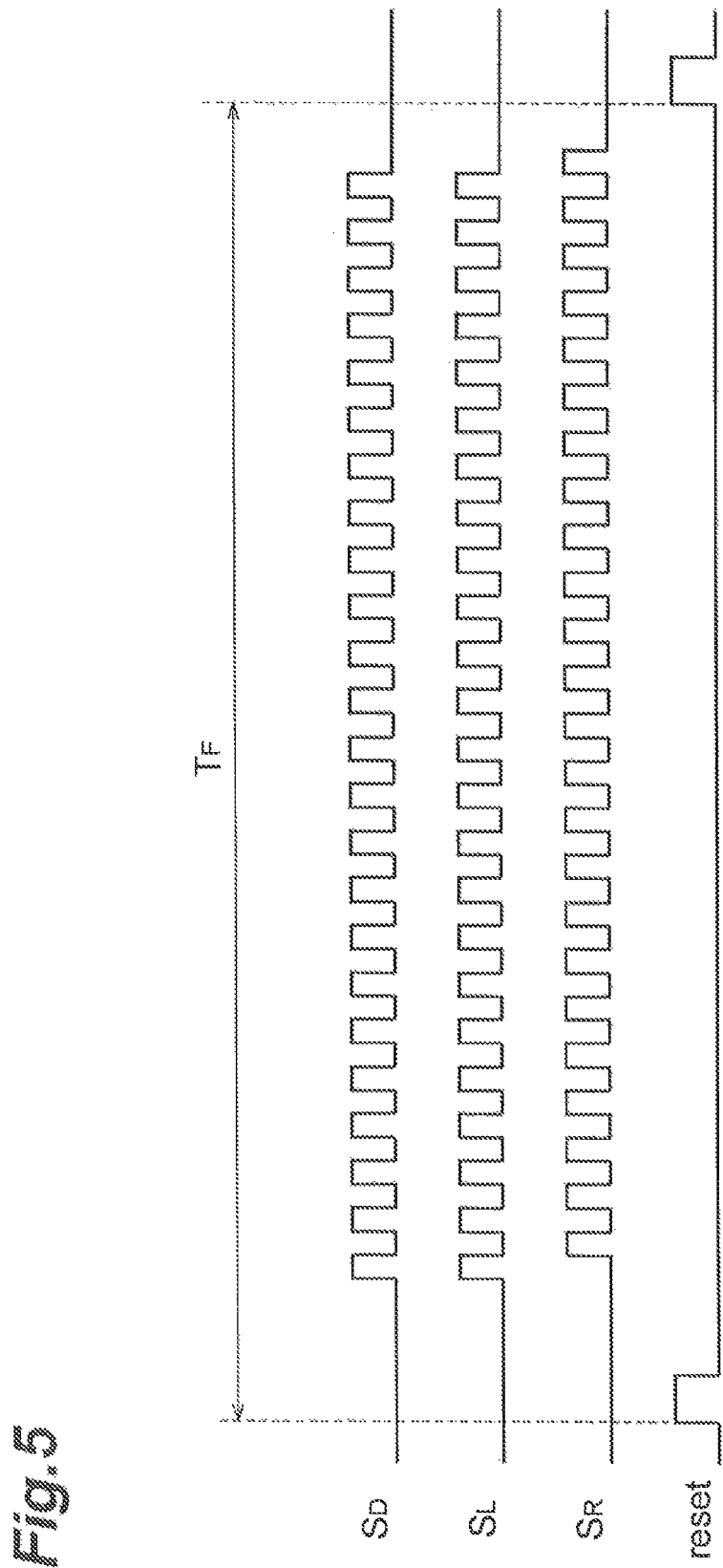
FIG. 5 is a timing chart of various signals.

FIG. 5 is a timing chart of various types of actual signals.

Within a term of one frame $T_F$, when attention is given to one pixel, a driving signal $S_D$ having a plurality of pulses is applied to a light source. In synchronization therewith, charge transfer signals $S_L$, $S_R$ are applied to transfer electrodes A and B so as to be mutually reverse in phase. It is noted that prior to a distance measurement, a reset signal, reset, is applied to a semiconductor region 3. Charges accumulated inside are discharged outside. In the present embodiment, the reset signal, reset, is turned ON for a moment and then turned OFF. Thereafter, a plurality of driving vibration pulses are sequentially applied and further, in synchronization therewith, charges are sequentially transferred, and charges are cumulatively accumulated inside the semiconductor region 3. Subsequently, before a next reset signal, reset, is turned ON, charges accumulated inside the semiconductor region 3 are read out.

Figure 6:
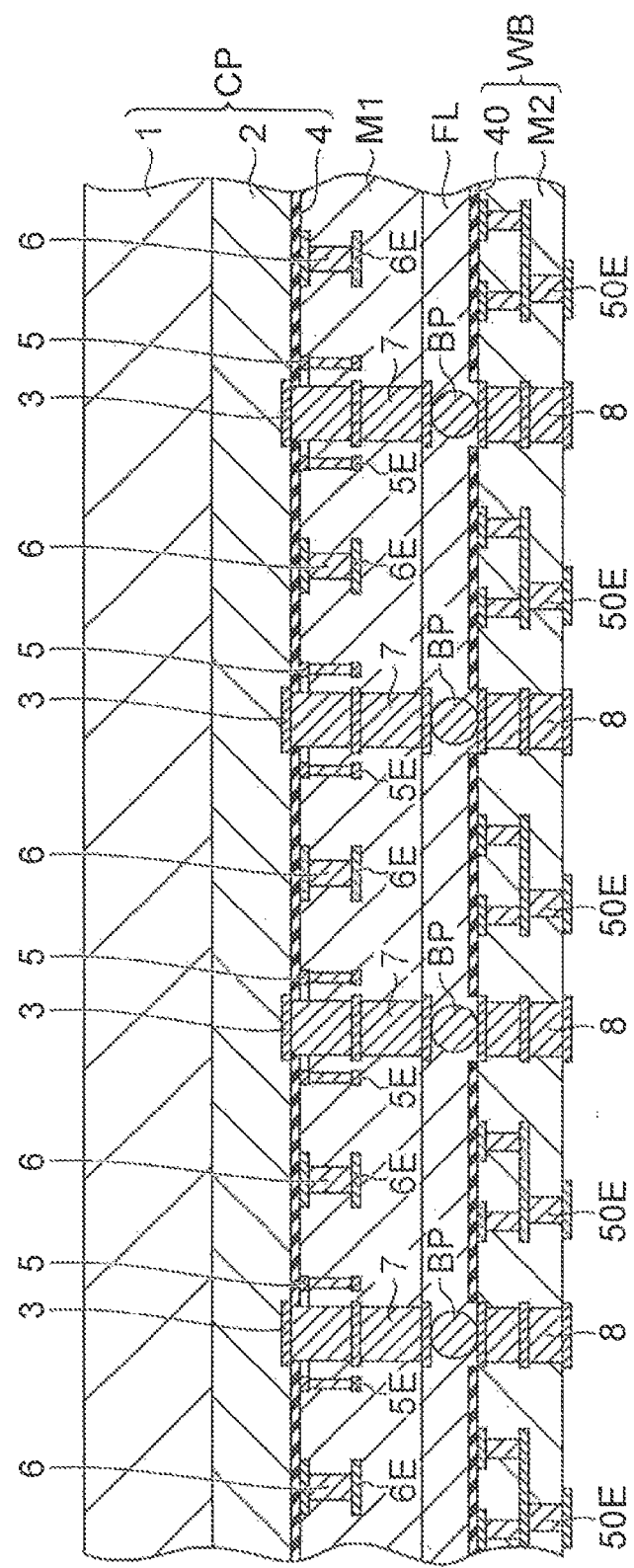
FIG. 6 is a partial cross sectional view of an imaging device with an imaging chip given in FIG. 2 attached to a wiring substrate.

FIG. 6 is a partial cross sectional view of an imaging device with an imaging chip given in FIG. 2 attached to a wiring substrate.

This imaging device is that in which the imaging chip CP given in FIG. 2 is inverted and stuck to a wiring substrate WB via a multilayer wiring substrate M1 and an adhesive agent FL. Inside the multilayer wiring substrate M1, there are provided through electrodes 7, 5E, 6E which are electrically connected respectively to each of the semiconductor regions 3, transfer electrodes 5 and potential adjusting portions 6. The through electrode 7 is connected via a bump electrode BP interposed between the wiring substrate WB and the multilayer wiring substrate M1 to a through electrode 8 of the wiring substrate WB. The through electrode 8 is exposed to the back of the wiring substrate WB. The through electrode 5E connected to each transfer electrode 5 is connected via a wiring (not illustrated) to an internal wiring 50E of the wiring substrate WB. On the surface on a boundary face of an insulating substrate M2 constituting the wiring substrate WB with the adhesive agent FL, a light-shielding layer 40 is formed, thereby preventing light which has passed through the imaging chip CP from being made incident into the wiring substrate WB.

Figure 7:
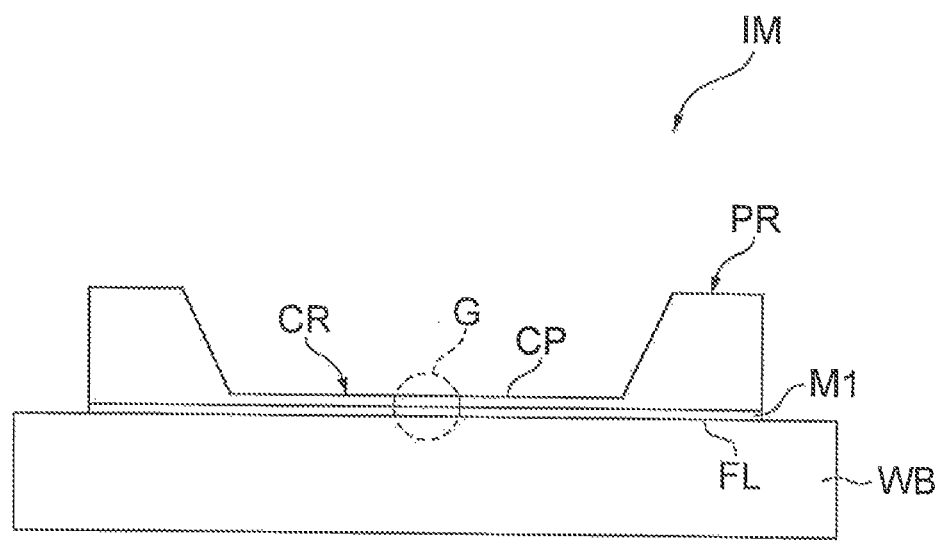
FIG. 7 is an overall cross sectional view of the imaging device.

FIG. 7 is an overall cross sectional view of the imaging device.

This imaging device is a range image measuring device which is of back side illumination type. An enlarged view of a region surrounded by the broken line G given in FIG. 7 corresponds to FIG. 6. The imaging chip CP is formed in such a manner that a central region CR is made thinner than a peripheral region PR, and the thinly formed region is given as an imaging region, and reflected light IM from an object is made incident. Since this device is not provided with an electrode on a light incidence side of a charge generating portion, it is possible to obtain distance output and a range image which are high in S/N ratio.

Figure 8:
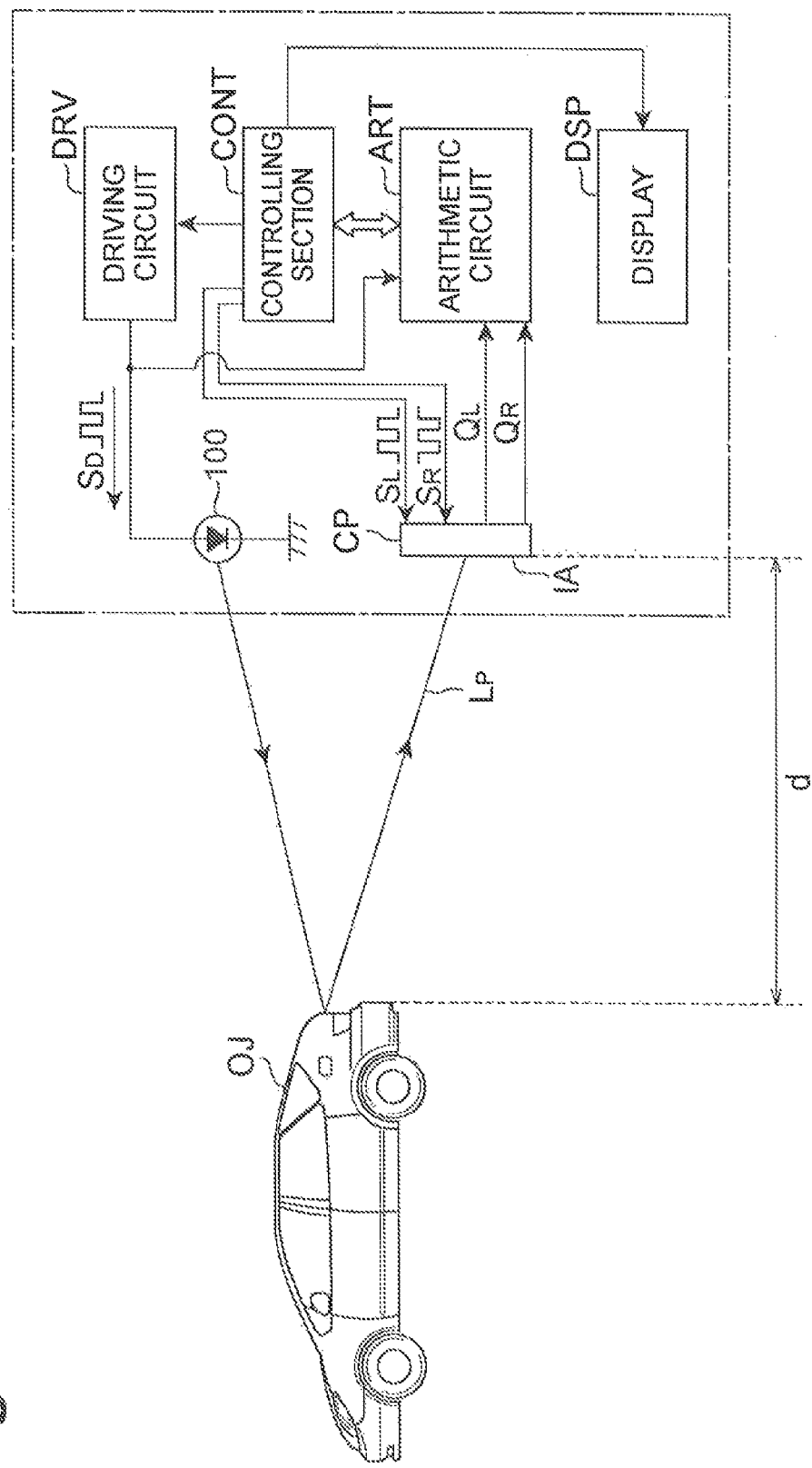
FIG. 8 is a view showing an overall constitution of a range image measuring device.

FIG. 8 is a view showing an overall constitution of the range image measuring device.

A distance, d, up to an object OJ is measured by a range image measuring device. As described above, to a light source 100 such as an LED, a driving signal $S_D$ is applied, and an intensity signal $L_P$ of a reflected light image which has been reflected on the object OJ is made incident into an imaging region IA of an imaging chip CP. From the imaging chip CP, at every pixel, charge quantities $Q_L$, $Q_R$ collected in synchronization with charge transfer signals $S_L$, $S_R$ are output. They are input into an arithmetic circuit ART in synchronization with a driving signal $S_D$. At the arithmetic circuit ART, as described above, the distance d is calculated at every pixel and calculation results are transferred to a controlling section CONT. The controlling section CONT controls a driving circuit DRV for driving a light source 100 and also outputs charge transfer signals $S_L$, $S_R$, thereby displaying the calculation results input from the arithmetic circuit ART on a display DSP.

Figure 9:
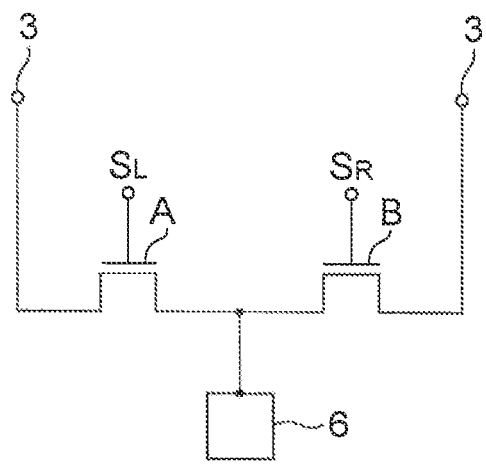
FIG. 9 is a circuit diagram inside a pixel.

FIG. 9 is a circuit diagram inside a pixel.

If the potential adjusting portion 6 is given as a charge generating region, charges generated at this region are distributed inside the semiconductor regions 3 on the right and left sides by alternately applying voltages to transfer electrodes A, B. It is noted that the transfer electrodes A, B constitute a gate electrode of each electrical-field effect transistor.

As described so far, the above-described range image sensor is a range image sensor which is provided on a semiconductor substrate with an imaging region composed of a plurality of two-dimensionally arranged units (pixel P), thereby obtaining a range image on the basis of charge quantities $Q_L$, $Q_R$ output from the units. One of the units is provided with a charge generating region (region outside a transfer electrode 5) where charges are generated in response to incident light, at least two semiconductor regions (charge collecting regions) 3 which are arranged spatially apart to collect charges from the charge generating region, and a transfer electrode 5 which is installed at each periphery of the semiconductor region 3, given a charge transfer signal different in phase, and surrounding the semiconductor region 3.

Therefore, a two-dimensional arrangement of a plurality of pixels P results in location of a plurality of transfer electrodes 5 at peripheries of charge generating regions. In another perspective, the charge generating regions are to locate at peripheries of the transfer electrodes 5. Since the transfer electrodes 5 surround the semiconductor region 3, charge transfer signals are imparted to the transfer electrodes 5, thereby making it possible to transfer charges from all the directions to the semiconductor regions 3. In other words, substantially all peripheral regions of the transfer electrodes 5 are allowed to function as charge generating regions, thereby remarkably improving an aperture ratio. Therefore, a signal level can be increased to obtain distance output excellent in S/N ratio and a range image as its aggregate information.

Further, the range image sensor of Embodiment 1 is provided with a potential adjusting portion 6 which is installed at a charge generating region to make steep a potential gradient from the charge generating region to a semiconductor region 3. The potential adjusting portion 6 makes the potential gradient steep, by which charges are transferred from the charge generating region to the charge collecting region 3 at a greater moving speed. In other words, high-speed imaging is made possible. It is noted that the potential adjusting portion 6 of Embodiment 1 is an electrode to which a predetermined potential is imparted. Preferably, in the present embodiment, to the electrode imparted is a potential lower than the lowest value of a potential imparted to a transfer electrode. Where a potential reverse to a potential resulting from a donor ionized at the charge collecting region (an acceptor where all conductive types are inverted) is imparted to the above electrode, it is possible to increase the potential gradient.

Figure 16:
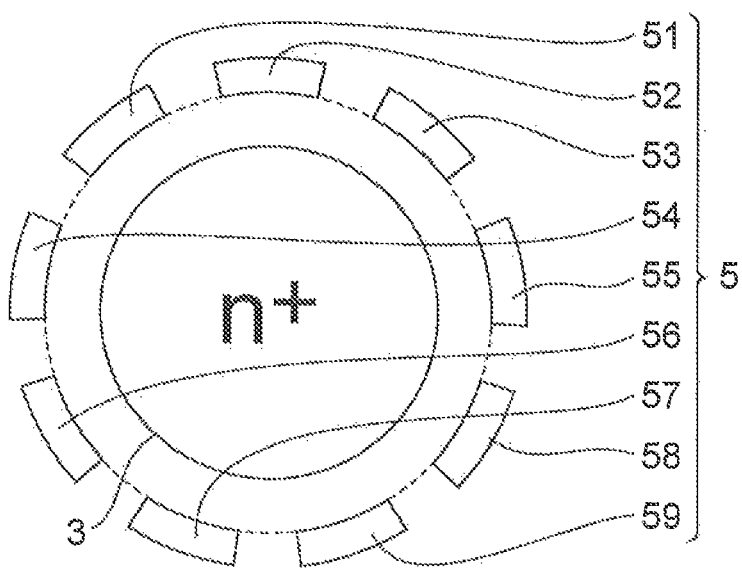
FIG. 16 is a view for explaining another constitution of a transfer electrode.

Still further, a transfer electrode 5 is formed in an annular shape, thus making it possible to reliably collect charges flowing from all the directions to a charge collecting region or prevent the inflow. A transfer electrode 5 is formed in a circular annular shape but may be formed in an angular annular shape. As shown in FIG. 16, it may also be constituted with a group of microelectrodes arranged apart along the annular shape. The transfer electrode 5 shown in FIG. 16 is that in which a plurality of partial transfer electrodes 51, 52, 53, 54, 55, 56, 57, 58, 59 are arranged apart at equal intervals. Each of the partial transfer electrodes 51 to 59 is formed in a circular arc shape, the inner side face of which runs along a circle indicated by the broken line. As described above, the transfer electrode 5 is constituted annularly so as to have a gap. However, in this instance, each of the microelectrodes is to be electrically connected so that a potential can be imparted simultaneously to all electrodes.

It is noted that in the above description, a region containing four transfer electrodes is given as one pixel. However, it may be a region containing two transfer electrodes to which charge transfer signals different in phase are applied.

Figure 10:
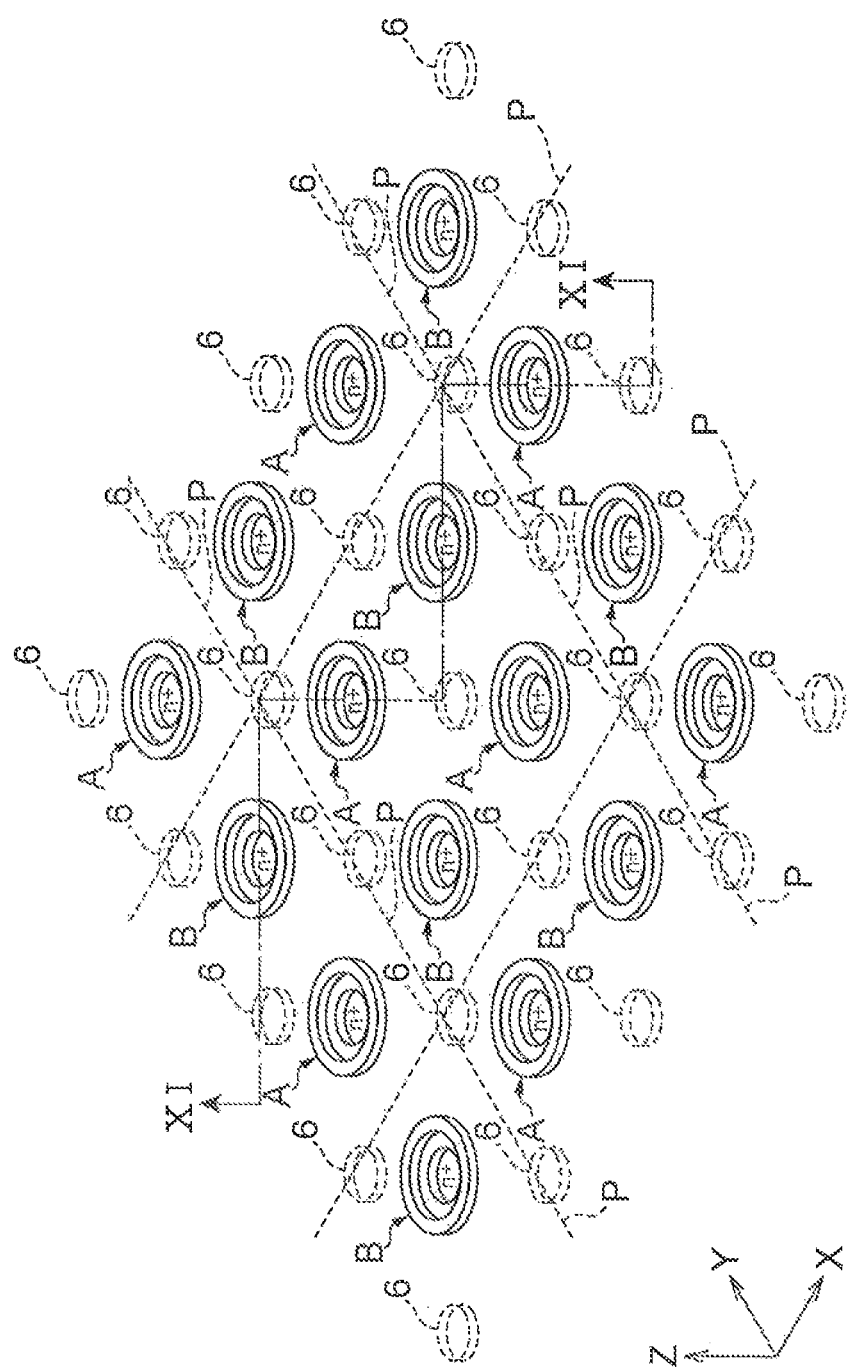
FIG. 10 is a perspective view of an imaging region of the range image sensor according to Embodiment 2.
Figure 11:
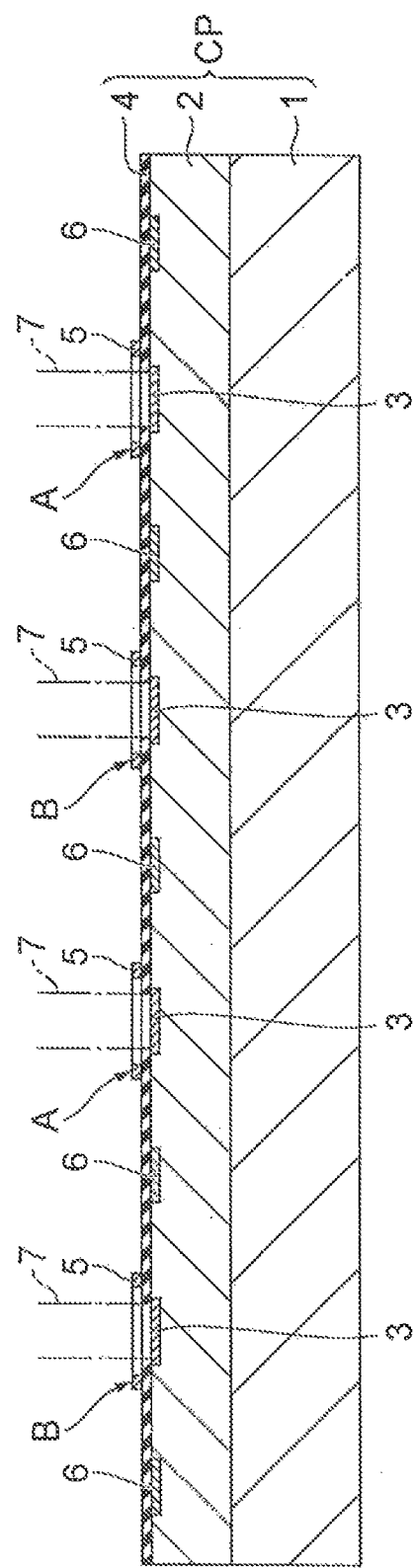
FIG. 11 is a cross sectional view taken along the arrow XI-XI of the imaging region given in FIG. 10.

FIG. 10 is a perspective view of an imaging region of the range image sensor according to Embodiment 2. FIG. 11 is a cross sectional view taken along the arrow XI-XI of the imaging region given in FIG. 10.

In Embodiment 1, as the potential adjusting portion 6, an electrode is used. The potential adjusting portion 6 of the present embodiment is located within a plane which is the same as that of the potential adjusting portion 6 in Embodiment 1 and a p-type semiconductor region formed under an insulating layer 4. In this instance, the potential adjusting portion 6 functions to increase a potential gradient as with Embodiment 1.

The potential adjusting portion 6 of the present embodiment is of conductive type different from the semiconductor region 3 and constituted with semiconductor regions higher in impurity concentration than peripheries. Therefore, the potential adjusting portion 6 is different in conductive type from the semiconductor region 3, thus making it possible to increase a potential gradient.

Figure 12:
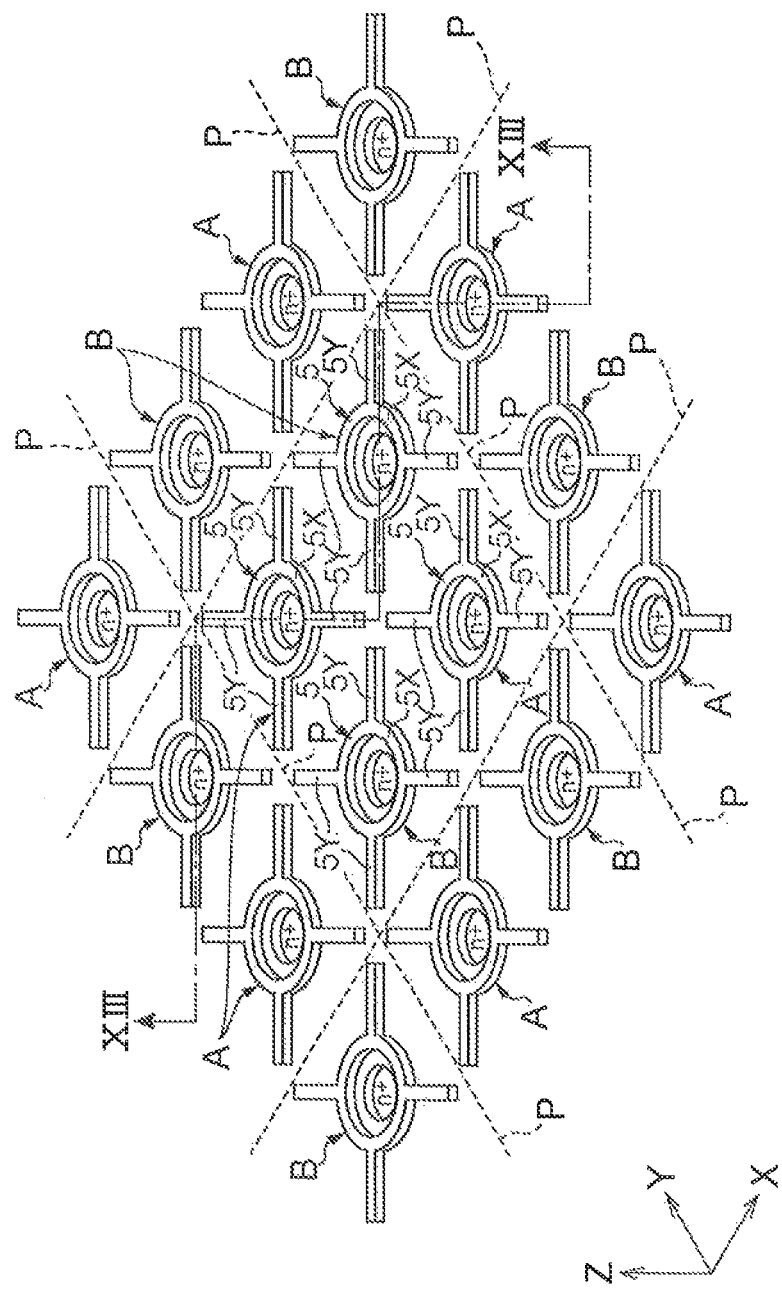
FIG. 12 is a perspective view of an imaging region of the range image sensor according to Embodiment 3.
Figure 13:
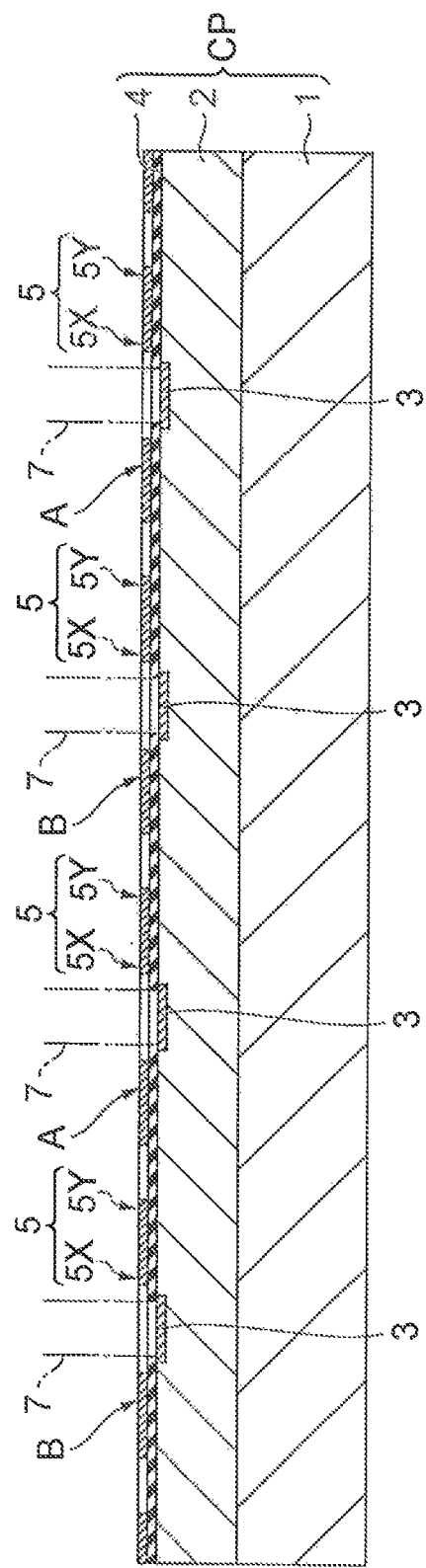
FIG. 13 is a cross sectional view taken along the arrow XIII-XIII of the imaging region given in FIG. 12.

FIG. 12 is a perspective view of an imaging region of the range image sensor according to Embodiment 3. FIG. 13 is a cross sectional view taken along the arrow XIII-XIII of the imaging region given in FIG. 12.

In the present embodiment, a transfer electrode 5 is constituted with an annular portion 5X and a radial portion 5Y extending outward radially from the annular portion 5X and not provided with a potential adjusting portion. The radial portion 5Y extends toward a site where the potential adjusting portion has been located in the above-described embodiments and is able to transfer charges generated around the site as well via the radial portion 5Y into the semiconductor region 3.

Figure 14:
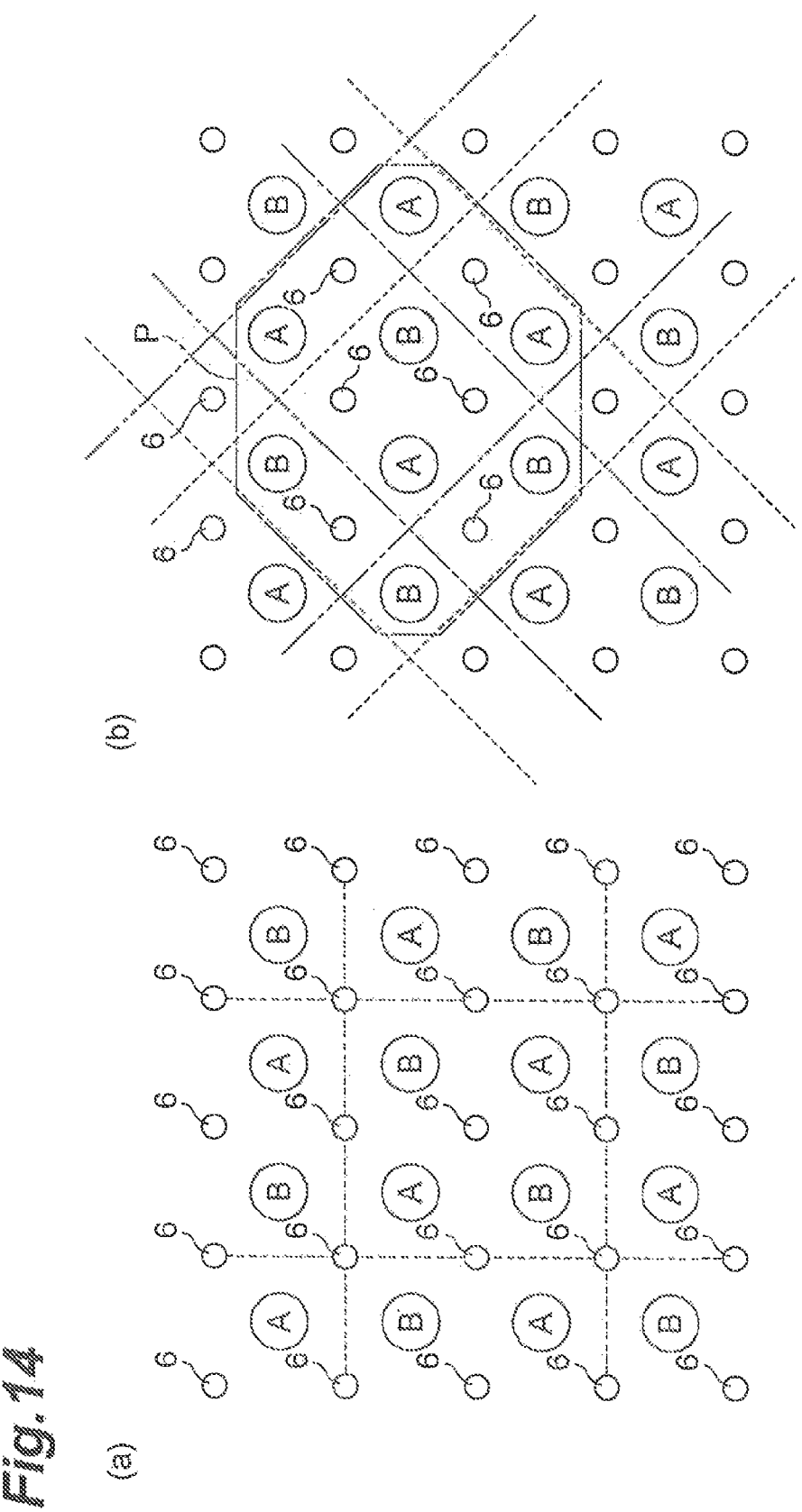
FIG. 14 is a view for explaining pixel arrangements.

FIG. 14 is a view for explaining pixel arrangements.

In Embodiments 1 to 3, as shown in FIG. 14(a), a description has been given that transfer electrodes A, B are arranged to give a quadrangular region containing four transfer electrodes as one pixel P. It is also acceptable that a group containing eight transfer electrodes A, B surrounded by the single dotted and dashed line shown in FIG. 14(b) is given as one pixel P. In FIG. 14(b), two transfer electrodes A, B adjacent to each other at the center belong to both a group of five transfer electrodes A, B surrounded by the broken line and a group of five transfer electrodes A, B surrounded by the double dotted and dashed line. In this instance, as shown in FIG. 14(a), charges are collected from a charge generating region that is almost twice the area compared with a case where a quadrangular region containing four transfer electrodes is given as one pixel. Therefore, such an effect is provided that enhances distance accuracy.

Figure 15:
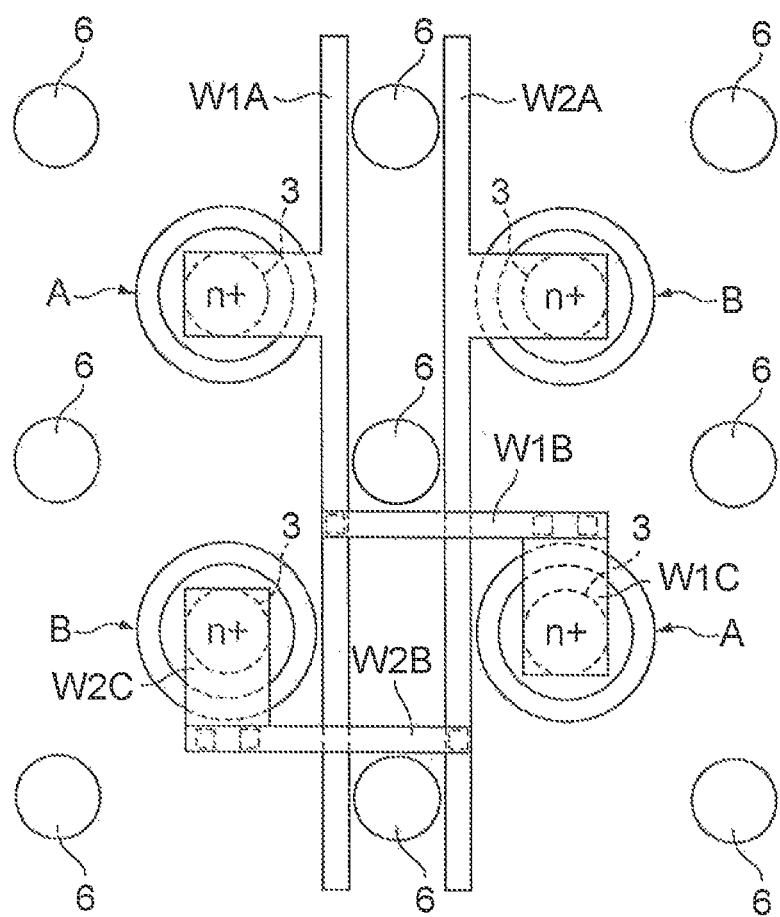
FIG. 15 is a view for explaining a connection at a received-charge collecting region.

FIG. 15 is a view for explaining a connection at a charge collecting region.

In this constitution, within one pixel, at least two semiconductor regions 3 surrounded by transfer electrodes A to which a charge transfer signal of the same phase is imparted are electrically connected. Further, in this constitution, within one pixel, at least two semiconductor regions 3 surrounded by transfer electrodes B to which a charge transfer signal of the same phase is imparted are electrically connected.

In order to connect semiconductor regions 3 surrounded by transfer electrodes A with each other, metal wires W1A, W1B, W1C are used. The metal wire W1A connected to a first semiconductor region 3 surrounded by transfer electrodes A is connected via a contact hole to the metal wire W1B, and the metal wire W1B is also connected via a contact hole to the metal wire W1C. The metal wire W1C is connected to a second semiconductor region 3.

Similarly, a metal wire W2A connected to a first semiconductor region 3 surrounded by transfer electrodes B is connected via a contact hole to a metal wire W2B, and the metal wire W2B is also connected via a contact hole to a metal wire W2C. The metal wire W2C is connected to a second semiconductor region 3 surrounded by transfer electrodes B.

In this instance, charge quantities output from semiconductor regions 3 of each group are averaged, thus making it possible to compensate for a difference in characteristics at each semiconductor region 3.

Further, as a charge collecting region, there is made an n-type semiconductor region 3 higher in concentration in a p-type epitaxial layer 2 which is grown on a p-type semiconductor substrate 1 and lower in concentration than the p-type semiconductor substrate 1. However, if a p-type layer higher in concentration than the p-type epitaxial layer 2 is installed at the bottom of the n-type semiconductor region 3 higher in concentration (on a boundary face with the p-type epitaxial layer 2), it is preferably possible to suppress effects of an electric field resulting from application of voltage to the n-type semiconductor region 3 higher in concentration. This is because, although there is such a possibility that application of voltage to the n-type semiconductor region 3 higher in concentration may result in the spread of a depleted layer between itself and the p-type epitaxial layer 2 and charges generated by light may flow into the n-type semiconductor region 3 higher in concentration due to the electric field inside the depleted layer, irrespective of potentials of transfer electrodes, a p-type layer higher in concentration than the p-type epitaxial layer 2 is installed under the n-type semiconductor region 3 higher in concentration, thus making it possible to prevent substantial spread of the depleted layer in the p-type epitaxial layer 2. It is noted that the above-described conductive types can be inverted all together.

INDUSTRIAL APPLICABILITY

The present invention is applicable to a range sensor and a range image sensor loaded on product monitors in a production line of a factory as well as on vehicles and others.

REFERENCE SIGNS LIST

3: Semiconductor region (charge collecting region)
5, A, B: Transfer electrode
6: Potential adjusting portion

The invention claimed is:

1. A range sensor comprising: a charge generating region at which charges are generated in response to incident light; a charge collecting region that collects the charges from the charge generating region; a transfer electrode provided at a periphery of the charge collecting region and completely surrounding the charge collecting region, and a potential adjusting portion that increases a potential gradient from the charge generating region to the charge collecting region.

2. The range sensor according to claim 1,
wherein the potential adjusting portion comprises a semiconductor region including a conductivity type different from that of the charge collecting region, and having an impurity concentration higher than that of peripheral part of the semiconductor region.

3. The range sensor according to claim 1,
wherein the potential adjusting portion comprises an electrode to which a predetermined potential is imparted.

4. The range sensor according to claim 1,
wherein the number of the potential adjusting portion is plural,
the plurality of the potential adjusting portions are arranged at corners of a square, respectively,
the diagonal lines of the square intersect at a right angle, and
the charge collecting region is positioned at the intersection of the diagonal lines.

5. The range sensor according to claim 1,
wherein the number of the charge collecting region is plural,
the potential adjusting portion is positioned between the charge collecting regions, and
the potential adjusting portion is commonly used for the charge collecting regions.

6. The range sensor according to claim 1,
wherein a shape of the transfer electrode is an annular shape.

7. A range image sensor comprising an imaging region comprised of a plurality of two-dimensionally arranged units on a semiconductor substrate, the imaging region obtaining range images based on charges outputted from the units,
wherein one of the units comprises the range sensor according to claim 1.

8. A range image sensor comprising an imaging region comprised of a plurality of two-dimensionally arranged units on a semiconductor substrate, the imaging region obtaining range images based on charges outputted from the units,
wherein one of the units comprises the range sensor according to claim 1, and
wherein the shape of the transfer electrode forms a ring.

9. A range image sensor comprising an imaging region comprised of a plurality of two-dimensionally arranged units on a semiconductor substrate, the imaging region obtaining range images based on charges outputted from the units,
wherein one of the units comprises the range sensor according to claim 1, and
wherein the transfer electrode transfers charges generated out of a region of the transfer electrode into an inside region of the transfer electrode,
the inside region is the charge collecting region, and
the charge collecting region is thoroughly surrounded by the transfer electrode.

10. A range image sensor comprising an imaging region comprised of a plurality of two-dimensionally arranged units on a semiconductor substrate, the imaging region obtaining range images based on charges outputted from the units,
wherein one of the units comprises the range sensor according to claim 1, and
wherein the transfer electrode transfers charges generated out of a region of the transfer electrode into the charge collecting regions from all directions.

* * * * *